(12) United States Patent
Wu et al.

(10) Patent No.: US 10,990,529 B2
(45) Date of Patent: Apr. 27, 2021

(54) MULTI-POWER-DOMAIN BRIDGE WITH PREFETCH AND WRITE MERGING

(71) Applicant: TEXAS INSTRUMENTS INCORPORATED, Dallas, TX (US)

(72) Inventors: Daniel Wu, Plano, TX (US); Kai Chirca, Dallas, TX (US); Matthew David Pierson, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 17 days.

(21) Appl. No.: 16/601,881

(22) Filed: Oct. 15, 2019

(65) Prior Publication Data

US 2020/0117606 A1 Apr. 16, 2020

Related U.S. Application Data

(60) Provisional application No. 62/745,842, filed on Oct. 15, 2018.

(51) Int. Cl.
*G06F 12/0875* (2016.01)
*G06F 12/084* (2016.01)
(Continued)

(52) U.S. Cl.
CPC ............ *G06F 12/084* (2013.01); *G06F 3/064* (2013.01); *G06F 3/0604* (2013.01); *G06F 3/0607* (2013.01); *G06F 3/0632* (2013.01); *G06F 3/0658* (2013.01); *G06F 3/0659* (2013.01); *G06F 3/0673* (2013.01); *G06F 3/0679* (2013.01); *G06F 9/30101* (2013.01); *G06F 9/30123* (2013.01); *G06F 9/3897* (2013.01); *G06F 9/4881* (2013.01); *G06F 9/5016* (2013.01); *G06F 12/0607* (2013.01); *G06F 12/0811* (2013.01); *G06F 12/0815* (2013.01); *G06F 12/0828* (2013.01); *G06F 12/0831* (2013.01); *G06F 12/0855* (2013.01); *G06F 12/0857* (2013.01); *G06F 12/0875* (2013.01);
(Continued)

(58) Field of Classification Search
None
See application file for complete search history.

(56) References Cited

U.S. PATENT DOCUMENTS 5,918,072 A * 6/1999 Bhattacharya .......... G06F 13/28
710/29
6,366,984 B1 * 4/2002 Carmean ............. G06F 12/0804
710/52
(Continued)

*Primary Examiner* — Elias Mamo
(74) *Attorney, Agent, or Firm* — Kenneth Liu; Charles A. Brill; Frank D. Cimino

(57) ABSTRACT

Techniques for accessing data, comprising receiving a first memory request associated with a first clock domain, converting a first memory address of the first memory request from a first memory address format associated with the first clock domain to a second memory address format associated with the second clock domain, transitioning the first memory request to a second clock domain, creating a first scoreboard entry associated with the first memory request, transmitting the first memory request to a memory based on the converted first memory address, receiving a first response to the first memory request, transitioning the first response to the second clock domain and clearing the first scoreboard entry based on the received response.

20 Claims, 5 Drawing Sheets

(51) Int. Cl.
| | |
|---|---|
| G06F 12/0811 | (2016.01) |
| G06F 12/1009 | (2016.01) |
| G06F 12/10 | (2016.01) |
| G06F 13/16 | (2006.01) |
| G06F 13/40 | (2006.01) |
| G06F 12/0855 | (2016.01) |
| G06F 12/06 | (2006.01) |
| G06F 12/0817 | (2016.01) |
| G06F 12/0831 | (2016.01) |
| G06F 13/12 | (2006.01) |
| G06F 3/06 | (2006.01) |
| G06F 12/0815 | (2016.01) |
| H03M 13/01 | (2006.01) |
| H03M 13/09 | (2006.01) |
| H03M 13/15 | (2006.01) |
| H03M 13/27 | (2006.01) |
| G06F 9/30 | (2018.01) |
| G06F 9/38 | (2018.01) |
| G06F 9/48 | (2006.01) |
| G06F 9/50 | (2006.01) |
| G06F 12/0891 | (2016.01) |

(52) U.S. Cl.
CPC .......... *G06F 12/0891* (2013.01); *G06F 12/10* (2013.01); *G06F 12/1009* (2013.01); *G06F 13/124* (2013.01); *G06F 13/1642* (2013.01); *G06F 13/1663* (2013.01); *G06F 13/1668* (2013.01); *G06F 13/4027* (2013.01); *H03M 13/015* (2013.01); *H03M 13/098* (2013.01); *H03M 13/1575* (2013.01); *H03M 13/276* (2013.01); *H03M 13/2785* (2013.01); *G06F 2212/1008* (2013.01); *G06F 2212/1016* (2013.01); *G06F 2212/1024* (2013.01); *G06F 2212/304* (2013.01); *G06F 2212/452* (2013.01); *G06F 2212/657* (2013.01)

(56) References Cited

U.S. PATENT DOCUMENTS

| | | | |
|---|---|---|---|
| 8,732,370 | B2 | 5/2014 | Chirca et al. |
| 9,152,586 | B2 | 10/2015 | Wu et al. |
| 9,298,665 | B2 | 3/2016 | Pierson et al. |
| 9,652,404 | B2 | 5/2017 | Pierson et al. |
| 9,817,759 | B2 * | 11/2017 | Shin .................. G06F 12/0811 |
| 2008/0028252 | A1 * | 1/2008 | Vera ......................... G06F 1/12 713/503 |
| 2010/0091538 | A1 * | 4/2010 | Kim ......................... G11C 7/10 365/51 |
| 2015/0143044 | A1 * | 5/2015 | Gulati ................ G06F 12/0802 711/121 |

* cited by examiner

MULTI-POWER-DOMAIN BRIDGE WITH PREFETCH AND WRITE MERGING

CROSS-REFERENCE TO RELATED APPLICATIONS

This application claims priority to U.S. Provisional Application No. 62/745,842 filed Oct. 15, 2018, which is hereby incorporated by reference.

BACKGROUND

In a multi-core coherent system, multiple processor and system components share the same memory resources, such as on-chip and off-chip memories. Memory caches (e.g., caches) typically are an amount of high-speed memory located operationally near (e.g., close to) a processor. A cache is more operationally nearer to a processor based on latency of the cache, that is, one many processor clock cycles for the cache to fulfill a memory request. Generally, cache memory closest to a processor includes a level 1 (L1) cache that is often directly on a die with the processor. Many processors also include a larger level 2 (L2) cache. This L2 cache is generally slower than the L1 cache but may still be on the die with the processor cores. The L2 cache may be a per processor core cache or shared across multiple cores. Often, a larger, slower L3 cache, either on die, as a separate component, or another portion of a system on a chip (SoC) is also available to the processor cores.

Ideally, if all components had the same cache structure, and would access shared resources through cache transactions, all the accesses would be identical throughout the entire system aligned with the cache block boundaries. But usually, some components have no caches, or, different components have different cache block sizes. For a heterogeneous system, accesses to the shared resources can have different attributes, types and sizes. For example, a central processing unit (CPU) of a system may have different sized or different speed memory caches as compared to a digital signal processor (DSP) of the system. On the other hand, the shared resources may also be in different formats with respect to memory bank structures, access sizes, access latencies and physical locations on the chip.

To maintain data coherency, a coherence interconnect is usually added in between the master components and shared resources to arbitrate among multiple masters' requests and guarantee data consistency when data blocks are modified for each resource slave. With various accesses from different components to different slaves, the interconnect usually handles the accesses in a serial fashion to guarantee atomicity and to meet slaves access requests. This makes the interconnect the access bottleneck for a multi-core multi-slave coherence system.

To reduce CPU cache miss stall overhead, cache components could issue cache allocate accesses with the request that the lower level memory hierarchy must return the "critical line first" to un-stall the CPU, then the non-critical line to finish the line fill. In a shared memory system, to serve one CPU's "critical line first" request could potentially extend the other CPU's stall overhead and reduce the shared memory throughput if the memory access types and sizes are not considered. The problem therefore to solve is how to serve memory accesses from multiple system components to provide low overall CPU stall overhead and guarantee maximum memory throughput.

Due to the increased number of shared components and expended sharable memory space, to support data consistency while reducing memory access latency for all cores while maintaining maximum shared memory bandwidth and throughput is a challenge.

SUMMARY

This disclosure relates to a processing system comprising one or more processors, a cache memory coupled to the one or more processors, and a memory controller coupled to the one or more processors via a bridge, the bridge comprising first interface circuitry configured to receive a first memory request associated with a first clock domain, address conversion circuitry configured to convert a first memory address associated with the first memory request from a first memory address format associated with the first clock domain to a second memory address format associated with the second clock domain, a plurality of buffers configured to transition the first memory request to a second clock domain, address hazarding circuitry configured to create a first scoreboard entry associated with the first memory request, second interface circuitry configured to transmit the first memory request to a memory based on the converted first memory address, and receive a first response to the first memory request, wherein the plurality of buffers is further configured to transition the first response to the second clock domain, and wherein the address hazarding circuitry is further configured to clear the first scoreboard entry based on the received response.

This disclosure also relates to an integrated circuit device comprising a bridge coupled to a memory controller and to one or more processors, the bridge comprising first interface circuitry configured to receive a first memory request associated with a first clock domain, address conversion circuitry configured to convert a first memory address, associated with the first memory request, from a first memory address format associated with the first clock domain to a second memory address format associated with the second clock domain, a plurality of buffers configured to transition the first memory request to a second clock domain, address hazarding circuitry configured to create a first scoreboard entry associated with the first memory request, second interface circuitry configured to transmit the first memory request to a memory based on the converted first memory address, and receive a first response to the first memory request, wherein the plurality of buffers is further configured to transition the first response to the second clock domain, and wherein the address hazarding circuitry is further configured to clear the first scoreboard entry based on the received response This disclosure also relates to a method for accessing data, comprising receiving a first memory request associated with a first clock domain, converting a first memory address of the first memory request from a first memory address format associated with the first clock domain to a second memory address format associated with the second clock domain, transitioning the first memory request to a second clock domain, creating a first scoreboard entry associated with the first memory request, transmitting the first memory request to a memory based on the converted first memory address, receiving a first response to the first memory request, transitioning the first response to the second clock domain and clearing the first scoreboard entry based on the received response.

BRIEF DESCRIPTION OF THE DRAWINGS

For a detailed description of various examples, reference will now be made to the accompanying drawings in which.

DETAILED DESCRIPTION

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC).

Figure 1:
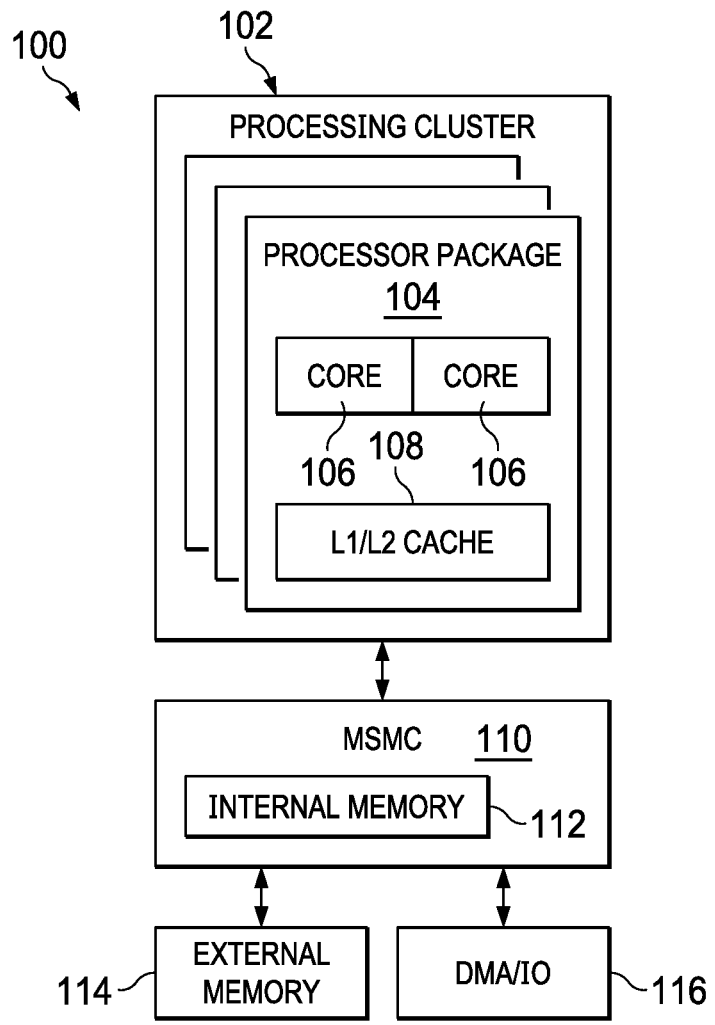
FIG. 1 illustrates a multi-core processing system, in accordance with aspects of the present disclosure.

FIG. 1 is a functional block diagram of a multi-core processing system 100, in accordance with aspects of the present disclosure. System 100 is a multi-core SoC that includes a processing cluster 102 including one or more processor packages 104. The one or more processor packages 104 may include one or more types of processors, such as a CPU, GPU, DSP, etc. As an example, a processing cluster 102 may include a set of processor packages split between DSP, CPU, and GPU processor packages. Each processor package 104 may include one or more processing cores. As used herein, the term "core" refers to a processing module that may contain an instruction processor, such as a digital signal processor (DSP) or other type of microprocessor. Each processor package also contains one or more caches 108. These caches 108 may include one or more L1 caches, and one or more L2 caches. For example, a processor package 104 may include four cores, each core including an L1 data cache and L1 instruction cache, along with an L2 cache shared by the four cores.

The multi-core processing system 100 also includes a multi-core shared memory controller (MSMC) 110, through which is connected one or more external memories 114 and input/output direct memory access clients 116. The MSMC 110 also includes an on-chip internal memory 112 system which is directly managed by the MSMC 110. In certain embodiments, the MSMC 110 helps manage traffic between multiple processor cores, other mastering peripherals or direct memory access (DMA) and allows processor packages 104 to dynamically share the internal and external memories for both program instructions and data. The MSMC internal memory 112 offers flexibility to programmers by allowing portions to be configured as shared level-2 RAM (SL2) or shared level-3 RAM (SL3). External memory 114 may be connected through the MSMC 110 along with the internal shared memory 112 via a memory interface (not shown), rather than to chip system interconnect as has traditionally been done on embedded processor architectures, providing a fast path for software execution. In this embodiment, external memory may be treated as SL3 memory and therefore cacheable in L1 and L2 (e.g., caches 108).

Figure 2:
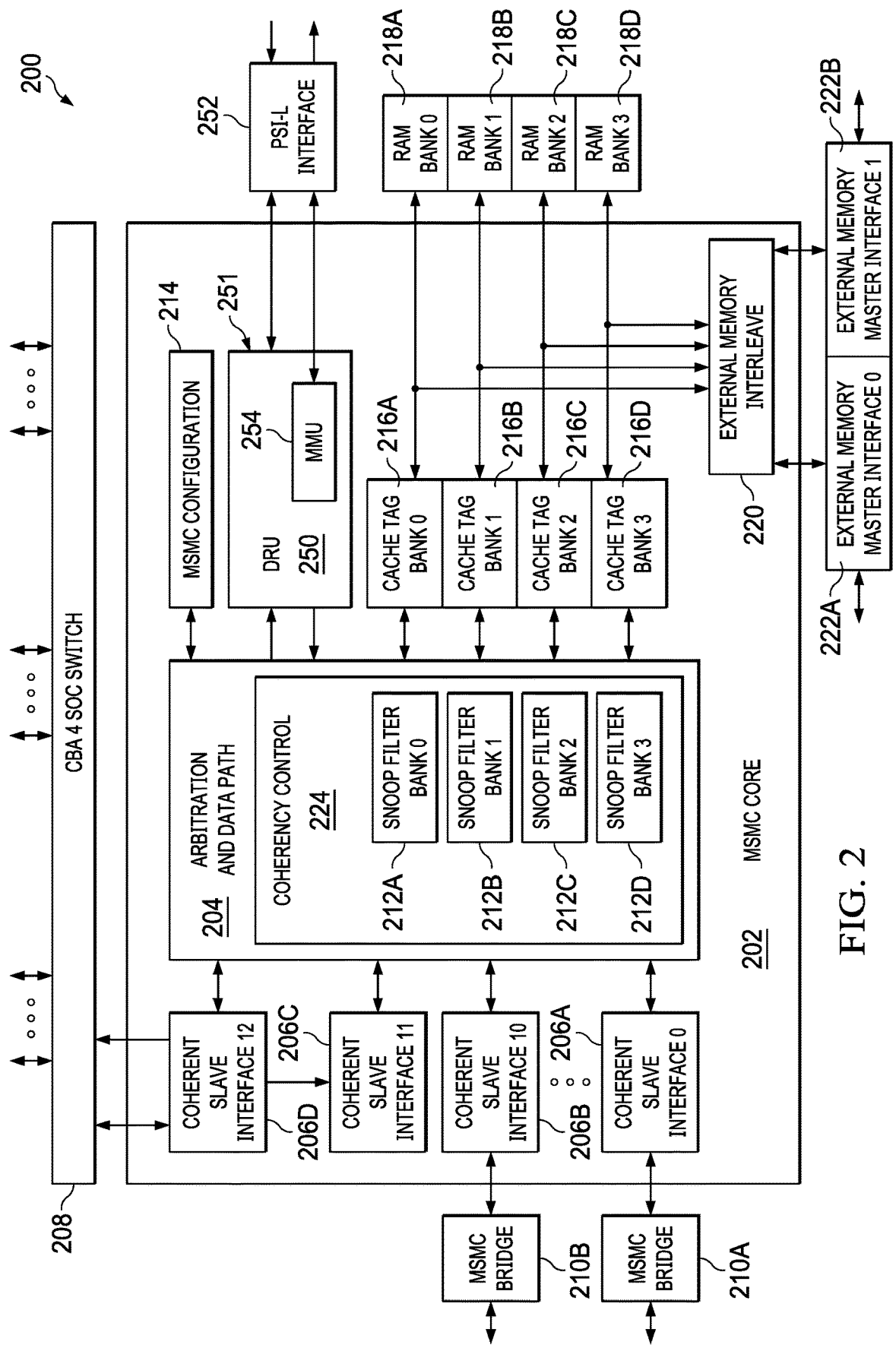
FIG. 2 is a functional block diagram of a MSMC, in accordance with aspects of the present disclosure.

FIG. 2 is a functional block diagram of a MSMC 200, in accordance with aspects of the present disclosure. The MSMC 200 may correspond to the MSMC 110 of FIG. 1. The MSMC 200 includes a MSMC core logic 202 defining the primary logic circuits of the MSMC. The MSMC 200 is configured to provide an interconnect between master peripherals (e.g., devices that access memory, such as processors, processor packages, direct memory access/input output devices, etc.) and slave peripherals (e.g., memory devices, such as double data rate random access memory, other types of random access memory, direct memory access/input output devices, etc.). Master peripherals connected to the MSMC 200 may include, for example, the processor packages 104 of FIG. 1. The master peripherals may or may not include caches. The MSMC 200 is configured to provide hardware based memory coherency between master peripherals connected to the MSMC 200 even in cases in which the master peripherals include their own caches. The MSMC 200 may further provide a coherent level 3 cache accessible to the master peripherals and/or additional memory space (e.g., scratch pad memory) accessible to the master peripherals.

The MSMC core 202 includes a plurality of coherent slave interfaces 206A-D. While in the illustrated example, the MSMC core 202 includes thirteen coherent slave interfaces 202 (only four are shown for conciseness), other implementations of the MSMC core 202 may include a different number of coherent slave interfaces 206. Each of the coherent slave interfaces 206A-D is configured to connect to one or more corresponding master peripherals (e.g., one of the processor packages 104 of FIG. 1). Example master peripherals include a processor, a processor package, a direct memory access device, an input/output device, etc. Each of the coherent slave interfaces 206 is configured to transmit data and instructions between the corresponding master peripheral and the MSMC core 202. For example, the first coherent slave interface 206A may receive a read request from a master peripheral connected to the first coherent slave interface 206A and relay the read request to other components of the MSMC core 202. Further, the first coherent slave interface 206A may transmit a response to the read request from the MSMC core 202 to the master peripheral.

In the illustrated example, a thirteenth coherent slave interface 206D is connected to a common bus architecture (CBA) system on chip (SOC) switch 208. The CBA SOC switch 208 may be connected to a plurality of master peripherals and be configured to provide a switched connection between the plurality of master peripherals and the MSMC core 202. While not illustrated, additional ones of the coherent slave interfaces 206 may be connected to a corresponding CBA. Alternatively, in some implementations, none of the coherent slave interfaces 206 is connected to a CBA SOC switch.

In some implementations, one or more of the coherent slave interfaces 206 interfaces with the corresponding master peripheral through a MSMC bridge 210 configured to provide one or more translation services between the master peripheral connected to the MSMC bridge 210 and the MSMC core 202. For example, ARM v7 and v8 devices utilizing the AXI/ACE and/or the Skyros protocols may be connected to the MSMC 200, while the MSMC core 202 may be configured to operate according to a coherence streaming credit-based protocol, such as Multi-core bus architecture (MBA). The MSMC bridge 210 helps convert between the various protocols, to provide bus width conversion, clock conversion, voltage conversion, or a combination thereof. In addition, or in the alternative to such translation services, the MSMC bridge 210 may provide cache prewarming support via an Accelerator Coherency Port (ACP) interface for accessing a cache memory of a coupled master peripheral and data error correcting code (ECC) detection and generation. In the illustrated example, the first coherent slave interface 206A is connected to a first MSMC bridge 210A and an eleventh coherent slave interface 210B is connected to a second MSMC bridge 210B. In other examples, more or fewer (e.g., 0) of the coherent slave interfaces 206 are connected to a corresponding MSMC bridge.

The MSMC core logic 202 includes an arbitration and data path manager 204. The arbitration and data path manager 204 includes a data path (e.g., a collection of wires, traces, other conductive elements, etc.) between the coherent slave interfaces 206 and other components of the MSMC core logic 202. The arbitration and data path manager 204 further includes logic configured to establish virtual channels between components of the MSMC 200 over shared physical connections (e.g., the data path). In addition, the arbitration and data path manager 204 is configured to arbitrate access to these virtual channels over the shared physical connections. Using virtual channels over shared physical connections within the MSMC 200 may reduce a number of connections and an amount of wiring used within the MSMC 200 as compared to implementations that rely on a crossbar switch for connectivity between components. In some implementations, the arbitration and data path 204 includes hardware logic configured to perform the arbitration operations described herein. In alternative examples, the arbitration and data path 204 includes a processing device configured to execute instructions (e.g., stored in a memory of the arbitration and data path 204) to perform the arbitration operations described herein. As described further herein, additional components of the MSMC 200 may include arbitration logic (e.g., hardware configured to perform arbitration operations, a processor configure to execute arbitration instructions, or a combination thereof). The arbitration and data path 204 may select an arbitration winner to place on the shared physical connections from among a plurality of requests (e.g., read requests, write requests, snoop requests, etc.) based on a priority level associated with a requestor, based on a fair-share or round robin fairness level, based on a starvation indicator, or a combination thereof.

The arbitration and data path 204 further include a coherency controller 224. The coherency controller 224 includes a snoop filter bank 212. The snoop filter banks 212 are hardware units that store information indicating which (if any) of the master peripherals stores data associated with lines of memory of memory devices connected to the MSMC 200. The coherency controller 224 is configured to maintain coherency of shared memory based on contents of the snoop filter banks 212.

The MSMC 200 further includes a MSMC configuration component 214 connected to the arbitration and data path 204. The MSMC configuration component 214 stores various configuration settings associated with the MSMC 200. In some implementations, the MSMC configuration component 214 includes additional arbitration logic (e.g., hardware arbitration logic, a processor configured to execute software arbitration logic, or a combination thereof).

The MSMC 200 further includes a plurality of cache tag banks 216. In the illustrated example, the MSMC 200 includes four cache tag banks 216A-D. In other implementations, the MSMC 200 includes a different number of cache tag banks 216 (e.g., 1 or more). In a particular example, the MSMC 200 includes eight cache tag banks 216. The cache tag banks 216 are connected to the arbitration and data path 204. Each of the cache tag banks 216 is configured to store "tags" indicating memory locations in memory devices connected to the MSMC 200. Each entry in the snoop filter banks 212 corresponds to a corresponding one of the tags in the cache tag banks 216. Thus, each entry in the snoop filter indicates whether data associated with a particular memory location is stored in one of the master peripherals.

Each of the cache tag banks 216 is connected to a corresponding RAM bank 218 and to a corresponding snoop filter bank 212. For example, a first cache tag bank 216A is connected to a first RAM bank 218A and to a first snoop filter bank 212A, etc. Each entry in the RAM banks 218 is associated with a corresponding entry in the cache tag banks 216 and a corresponding entry in the snoop filter banks 212. The RAM banks 218 may correspond to the internal memory 112 of FIG. 1. Entries in the RAM banks 218 may be used as an additional cache or as additional memory space based on a setting stored in the MSMC configuration component 214. The cache tag banks 216 and the RAM banks 218 may correspond to RAM modules (e.g., static RAM). While not illustrated in FIG. 2, the MSMC 200 may include read modify write queues connected to each of the RAM banks 218. These read modify write queues may include arbitration logic, buffers, or a combination thereof. Each snoop filter bank 212—cache tag bank 216—RAM bank 218 grouping may receive input and generate output in parallel.

The MSMC 200 further includes an external memory interleave component 220 connected to the cache tag banks 216 and the RAM banks 218. One or more external memory master interfaces 222 are connected to the external memory interleave 220. The external memory interfaces 222 are configured to connect to external memory devices (e.g., DDR devices, direct memory access input/output (DMA/IO) devices, etc.) and to exchange messages between the external memory devices and the MSMC 200. The external memory devices may include, for example, the external memories 114 of FIG. 1, the DMA/IO clients 116, of FIG. 1, or a combination thereof. The external memory interleave component 220 is configured to interleave or separate address spaces assigned to the external memory master interfaces 222. While two external memory master interfaces 222A-B are shown, other implementations of the MSMC 200 may include a different number of external memory master interfaces 222. In some implementations, the external memory master interfaces 222 support 48-bit physical addressing for connected memory devices.

The MSMC 200 also includes a data routing unit (DRU) 250, which helps provide integrated address translation and cache prewarming functionality and is coupled to a packet streaming interface link (PSI-L) interface 252, which is a system wide bus supporting DMA control messaging.

DMA control messaging may be used by applications to perform memory operations, such as copy or fill operations, in an attempt to reduce the latency time needed to access that memory. Additionally, DMA control messaging may be used to offload memory management tasks from a processor. However, traditional DMA controls have been limited to using physical addresses rather than virtual memory addresses. Virtualized memory allows applications to access memory using a set of virtualized memory addresses without having any knowledge of the physical memory addresses. An abstraction layer handles translating between the virtual memory addresses and physical addresses. Typically, this abstraction layer is accessed by application software via a supervisor privileged space. For example, an application having a virtual address for a memory location and seeking to send a DMA control message may first make a request into a privileged process, such as an operating system kernel requesting a translation between the virtual address to a physical address prior to sending the DMA control message. In cases where the memory operation crosses memory pages, the application may have to make separate translation requests for each memory page. Additionally, when a task first starts, memory caches for a processor may be "cold" as no data has yet been accessed from memory and these caches have not yet been filled. The costs for the initial memory fill and abstraction layer translations can bottleneck certain tasks, such as small to medium sized tasks which access large amounts of memory. Improvements to DMA control message operations may help improve these bottlenecks.

Figure 3:
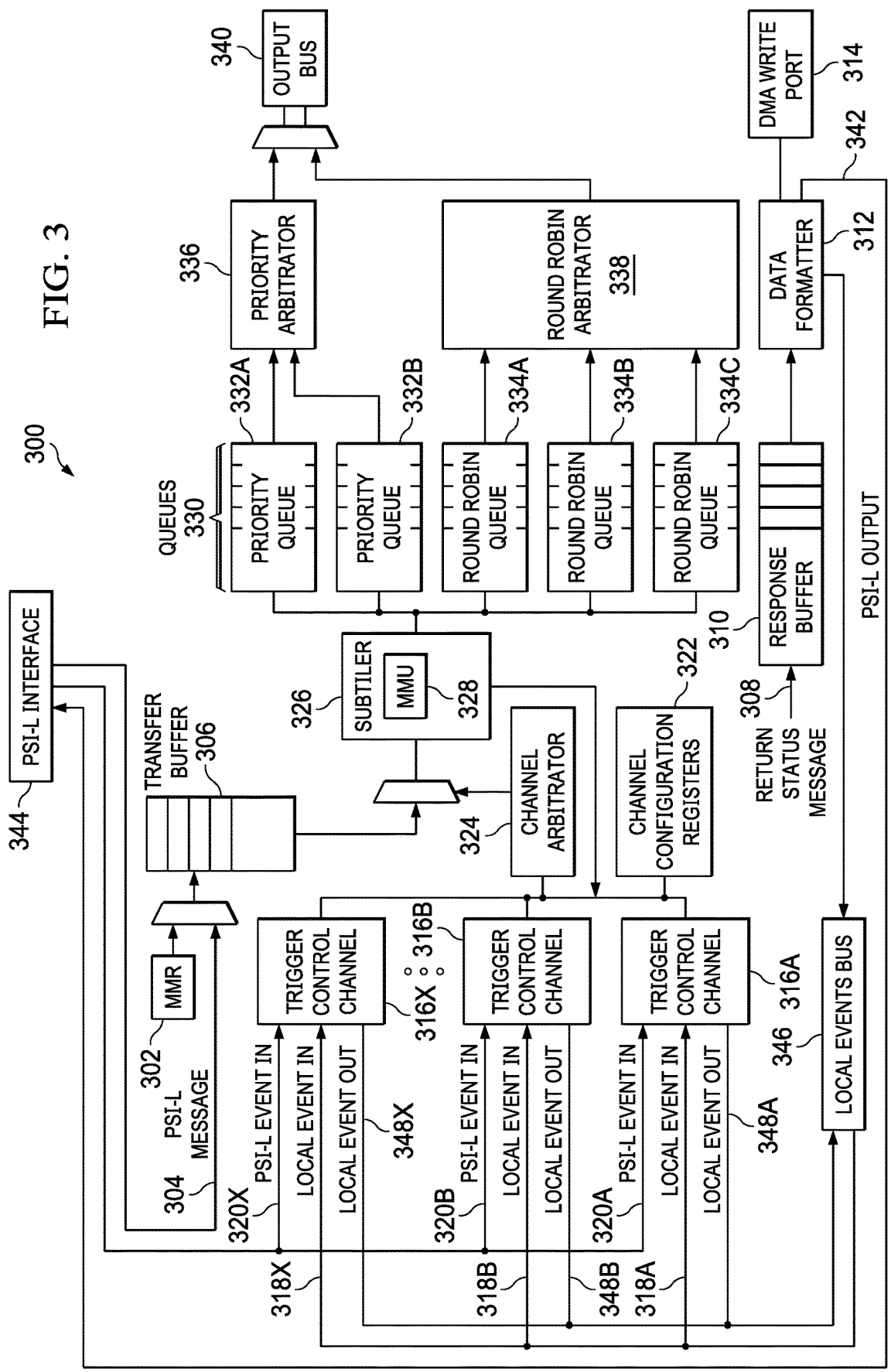
FIG. 3 is a block diagram of a DRU, in accordance with aspects of the present disclosure.

FIG. 3 is a block diagram of a DRU 300, in accordance with aspects of the present disclosure. The DRU 300 can operate on two general memory access commands, a transfer request (TR) command to move data from a source location to a destination location, and a cache request (CR) command to send messages to a specified cache controller or memory management units (MMUs) to prepare the cache for future operations by loading data into memory caches which are operationally closer to the processor cores, such as a L1 or L2 cache, as compared to main memory or another cache that may be organizationally separated from the processor cores. The DRU 300 may receive these commands via one or more interfaces. In this example, two interfaces are provided, a direct write of a memory mapped register (MMR) 302 and via a PSI-L message 304 via a PSI-L interface 344 to a PSI-L bus. In certain cases, the memory access command and the interface used to provide the memory access command may indicate the memory access command type, which may be used to determine how a response to the memory access command is provided.

The PSI-L bus may be a system bus that provides for DMA access and events across the multi-core processing system, as well as for connected peripherals outside of the multi-core processing system, such as power management controllers, security controllers, etc. The PSI-L interface 344 connects the DRU 300 with the PSI-L bus of the processing system. In certain cases, the PSI-L may carry messages and events. PSI-L messages may be directed from one component of the processing system to another, for example from an entity, such as an application, peripheral, processor, etc., to the DRU. In certain cases, sent PSI-L messages receive a response. PSI-L events may be placed on and distributed by the PSI-L bus by one or more components of the processing system. One or more other components on the PSI-L bus may be configured to receive the event and act on the event. In certain cases, PSI-L events do not require a response.

The PSI-L message 304 may include a TR command. The PSI-L message 304 may be received by the DRU 300 and checked for validity. If the TR command fails a validity check, a channel ownership check, or transfer buffer 306 fullness check, a TR error response may be sent back by placing a return status message 308, including the error message, in the response buffer 310. If the TR command is accepted, then an acknowledgement may be sent in the return status message. In certain cases, the response buffer 310 may be a first in, first out (FIFO) buffer. The return status message 308 may be formatted as a PSI-L message by the data formatter 312 and the resulting PSI-L message 342 sent, via the PSI-L interface 344, to a requesting entity which sent the TR command.

A relatively low-overhead way of submitting a TR command, as compared to submitting a TR command via a PSI-L message, may also be provided using the MMR 302. According to certain aspects, a core of the multi-core system may submit a TR request by writing the TR request to the MMR circuit 302. The MMR may be a register of the DRU 300, such as a register in the MSMC configuration component 214. In certain cases, the MSMC may include a set of registers and/or memory ranges which may be associated with the DRU 300. When an entity writes data to this associated memory range, the data is copied to the MMR 302 and passed into the transfer buffer 306. The transfer buffer 306 may be a FIFO buffer into which TR commands may be queued for execution. In certain cases, the TR request may apply to any memory accessible to the DRU 300, allowing the core to perform cache maintenance operations across the multi-core system, including for other cores.

The MMR 302, in certain embodiments, may include two sets of registers, an atomic submission register and a non-atomic submission register. The atomic submission register accepts a single 64 byte TR command, checks the values of the burst are valid values, pushes the TR command into the transfer buffer 306 for processing, and writes a return status message 308 for the TR command to the response buffer 310 for output as a PSI-L event. In certain cases, the MMR 302 may be used to submit TR commands but may not support messaging the results of the TR command, and an indication of the result of the TR command submitted by the MMR 302 may be output as a PSI-L event, as discussed above.

The non-atomic submission register provides a set of register fields (e.g., bits or designated set of bits) which may be written into over multiple cycles rather than in a single burst. When one or more fields of the register, such as a type field, is set, the contents of the non-atomic submission register may be checked and pushed into the transfer buffer 306 for processing and an indication of the result of the TR command submitted by the MMR 302 may be output as a PSI-L event, as discussed above.

Commands for the DRU may also be issued based on one or more events received at one or more trigger control channels 316A-316X. In certain cases, multiple trigger control channels 316A-316X may be used in parallel on common hardware and the trigger control channels 316A-316X may be independently triggered by received local events 318A-318X and/or PSI-L global events 320A-320X. In certain cases, local events 318A-318X may be events sent from within a local subsystem controlled by the DRU and local events may be triggered by setting one or more bits in a local events bus 346. PSI-L global events 320A-320X may be triggered via a PSI-L event received via the PSI-L interface 344. When a trigger control channel is triggered, local events 348A-348X may be output to the local events bus 346.

Each trigger control channel may be configured, prior to use, to be responsive to (e.g., triggered by) a particular event, either a particular local event or a particular PSI-L global event. In certain cases, the trigger control channels 316A-316X may be controlled in multiple parts, for example, via a non-realtime configuration, intended to be controlled by a single master, and a realtime configuration controlled by a software process that owns the trigger control channel via one or more received channel configuration commands. Control of the trigger control channels 316A-316X may be set up via one or more received channel configuration commands.

Non-realtime configuration may be performed, for example, by a single master, such as a privileged process, such as a kernel application. The single master may receive a request to configure a trigger control channel from an entity. The single master then initiates a non-realtime configuration via MMR writes to a particular region of channel configuration registers 322, where regions of the channel configuration registers 322 correlate to a particular trigger control channel being configured. The configuration includes fields which allow the particular trigger control channel to be assigned, an interface to use to obtain the TR command, such as via the MMR 302 or PSI-L message 304, which queue of one or more queues 330 a triggered TR command should be sent to, and one or more events to output on the PSI-L bus after the TR command is triggered. The trigger control channel being configured then obtains the TR command from the assigned interface and stores the TR command. In certain cases, the TR command includes triggering information. The triggering information indicates to the trigger control channel what events the trigger control is responsive to (e.g. triggering events). These events may be particular local events internal to the memory controller or global events received via the PSI-L interface 344. Once the non-realtime configuration is performed for the particular channel, a realtime configuration register of the channel configuration registers 322 may be written by the single master to enable the trigger control channel. In certain cases, a trigger control channel can be configured with one or more triggers. The triggers can be a local event, or a PSI-L global event. Realtime configuration may also be used to pause or teardown the trigger control channel.

Once a trigger control channel is activated, the channel waits until the appropriate trigger is received. For example, a peripheral may configure a particular trigger control channel, in this example trigger control channel 316B, to respond to PSI-L events and, after activation of the trigger control channel 316B, the peripheral may send a triggering PSI-L event 320B to the trigger control channel 316B. Once triggered, the TR command is sent by the trigger control channels 316A-316X. The sent TR commands are arbitrated by the channel arbitrator 324 for translation by the subtiler 326 into an op code operation addressed to the appropriate memory. In certain cases, the arbitration is based on a fixed priority associated with the channel and a round robin queue arbitration may be used for queue arbitration to determine the winning active trigger control channel. In certain cases, a particular trigger control channel, such as trigger control channel 316B, may be configured to send a request for a single op code operation and the trigger control channel cannot send another request until the previous request has been processed by the subtiler 326.

In accordance with aspects of the present disclosure, the subtiler 326 includes a memory management unit (MMU) 328. In some implementations, the MMU 328 corresponds to the MMU 254 of FIG. 2. The MMU 328 helps translate virtual memory addresses to physical memory addresses for the various memories that the DRU can address, for example, using a set of page tables to map virtual page numbers to physical page numbers. In certain cases, the MMU 328 may include multiple fully associative micro translation lookaside buffers (uTLBs) which are accessible and software manageable, along with one or more associative translation lookaside buffers (TLBs) caches for caching system page translations. In use, an entity, such as an application, peripheral, processor, etc., may be permitted to access a particular virtual address range for caching data associated with the application. The entity may then issue DMA requests, for example via TR commands, to perform actions on virtual memory addresses within the virtual address range without having to first translate the virtual memory addresses to physical memory addresses. As the entity can issue DMA requests using virtual memory addresses, the entity may be able to avoid calling a supervisor process or other abstraction layer to first translate the virtual memory addresses. Rather, virtual memory addresses in a TR command, received from the entity, are translated by the MMU to physical memory addresses. The MMU 328 may be able to translate virtual memory addresses to physical memory addresses for each memory the DRU can access, including, for example, internal and external memory of the MSMC, along with L2 caches for the processor packages.

In certain cases, the DRU can have multiple queues and perform one read or one write to a memory at a time. Arbitration of the queues may be used to determine an order in which the TR commands may be issued. The subtiler 326 takes the winning trigger control channel and generates one or more op code operations using the translated physical memory addresses, by, for example, breaking up a larger TR into a set of smaller transactions. The subtiler 326 pushes the op code operations into one or more queues 330 based, for example, on an indication in the TR command on which queue the TR command should be placed. In certain cases, the one or more queues 330 may include multiple types of queues which operate independently of each other. In this example, the one or more queues 330 include one or more priority queues 332A-332B and one or more round robin queues 334A-334C. The DRU may be configured to give priority to the one or more priority queues 332A-332B. For example, the priority queues may be configured such that priority queue 332A has a higher priority than priority queue 332B, which would in turn have a higher priority than another priority queue (not shown). The one or more priority queues 332A-332B (and any other priority queues) may all have priority over the one or more round robin queues 334A-334C. In certain cases, the TR command may specify a fixed priority value for the command associated with a particular priority queue and the subtiler 326 may place those TR commands (and associated op code operations) into the respective priority queue. Each queue may also be configured so that a number of consecutive commands that may be placed into the queue. As an example, priority queue 332A may be configured to accept four consecutive commands. If the subtiler 326 has five op code operations with fixed priority values associated with priority queue 332A, the subtiler 326 may place four of the op code operations into the priority queue 332A. The subtiler 326 may then stop issuing commands until at least one of the other TR commands is cleared from priority queue 332A. Then the subtiler 326 may place the fifth op code operation into priority queue 332A. A priority arbitrator 336 performs arbitration as to the priority queues 332A-332B based on the priority associated with the individual priority queues.

As the one or more priority queues 332A-332B have priority over the round robin queues 334A-334C, once the one or more priority queues 332A-332B are empty, the round robin queues 334A-334C are arbitrated in a round robin fashion, for example, such that each round robin queue may send a specified number of transactions through before the next round robin queue is selected to send the specified number of transactions. Thus, each time arbitration is performed by the round robin arbitrator 338 for the one or more round robin queues 334A-334C, the round robin queue below the current round robin queue will be the highest priority and the current round robin queue will be the lowest priority. If an op code operation gets placed into a priority queue, the priority queue is selected, and the current round robin queue retains the highest priority of the round robin queues. Once an op code operation is selected from the one or more queues 330, the op code operation is output via an output bus 340 to the MSMC central arbitrator (e.g., arbitration and data path 204 of FIG. 2) for output to the respective memory.

In cases where the TR command is a read TR command (e.g., a TR which reads data from the memory), once the requested read is performed by the memory, the requested block of data is received in a return status message 308, which is pushed onto the response buffer 310. The response is then formatted by the data formatter 312 for output. The data formatter 312 may interface with multiple busses for outputting, based on the information to be output. For example, if the TR includes multiple loops to load data and specifies a particular loop in which to send an event associated with the TR after the second loop, the data formatter 312 may count the returns from the loops and output the event after the second loop result is received.

In certain cases, write TR commands may be performed after a previous read command has been completed and a response received. If a write TR command is preceded by a read TR command, arbitration may skip the write TR command or stop if a response to the read TR command has not been received. A write TR may be broken up into multiple write op code operations and these multiple write op code operations may be output to the MSMC central arbitrator (e.g., arbitration and data path 204 of FIG. 2) for transmission to the appropriate memory prior to generating a write completion message. Once all the responses to the multiple write op code operations are received, the write completion message may be output.

In addition to TR commands, the DRU may also support CR commands. In certain cases, CR commands may be a type of TR command and may be used to prewarm a memory or cache, that is, to place data into an appropriate memory or cache closer to a core than main memory prior to the data being needed. Prewarming a cache for a processor core helps loads data from a memory into the cache before an instruction executing on the processor core requests the data. Prewarming may occur before execution of the instruction or before execution of a process that includes the instruction. As the CR command is a type of TR command, CR commands can be received and processed by the DRU in any manner a TR command may be received and processed. By preloading the data, before the data is needed by the core, the core is able to find the data in the memory or cache close to the core rather than having to request the data from, for example, main memory or persistent storage. As an example, if an entity knows that a core will soon need data that is not currently cached (e.g., data not used previously, just acquired data, etc.), the entity may issue a CR command to prewarm a cache associated with the core. This CR command may be targeted to a core currently executing a process or another core. In certain cases, the CR command may write data into a L2 cache of a processor package that is shared as among the cores of the processor package. As another example, a scheduler program may schedule a second process to execute after the currently running first process. The scheduler may, prior to switching over to the second process, issue one or more CR commands to prewarm caches in preparation for the second process. As the scheduler should know which core the second process will be scheduled on, the scheduler can specify, for example in a field of the CR command, which core the CR command may be targeted to.

In accordance with aspects of the present disclosure, how a CR command is passed to the target memory varies based on the memory or cache being targeted. As an example, a received CR command may target an L2 cache of a processor package. The subtiler 326 may format the CR command to a read op code operation. The read op code operation may include an indication that the read op code operation is a prewarming operation and passed, via the output bus 340 to the MSMC. Based on the indication that the read op code is a prewarming operation, the MSMC routes the read op code operation to the appropriate memory's memory controller. For example, where the scheduler issues the CR command to prewarm a L2 cache for a specific core, the CR command may include an indication to prewarm a specific portion of the L2 cache shared by the specific core with one or more other cores of the processor package. This L2 cache may be specific to the processor package and not shared with cores of another processor package. The subtiler 326 may format the CR command to a read op code specific to that processor package and the MSMC routes the read op code to the L2 memory controller of that processor package. By issuing the read op code to the memory controller, the memory controller may attempt to load the requested data into the L2 cache to fulfill the read in the same manner as any other cache load operation. The memory controller is then aware that the requested data is stored in the L2 cache and can provide the data when the core requests the requested data. Once the requested data is stored in the L2 cache, the memory controller may send a return message indicating that the load was successful to the MSMC. This message may be received by the response buffer 310 and may be output as a PSI-L output 342 as an event.

As another example, to prewarm a L2 cache for a specific core, the subtiler 326 may format the CR command to a read op code specific to that processor package and the MSMC routes the read op code for execution by one or more cores of the processor package. The core then executes the read and loading the requested data into the shared L2 cache of the core. An event may be sent back to the MSMC indicating that the prewarming has been completed.

As a third example, to prewarm a L2 cache for another core that is coupled via the MSMC bridge, the subtiler 326 may format the CR command for the MSMC bridge and the MSMC routes the message to the MSMC bridge. The MSMC bridge may then translate the message into a read op code for the other core and transmit the read op code, for example, via the ACP port to the memory interface of the other core. The other core may send a response back to the MSMC bridge when the read op code has been completed and the requested data loaded into the shared L2 cache of the other core. This response may include the requested data, which may be discarded by the MSMC bridge. The MSMC bridge may also send an event back to the MSMC indicating that the prewarming has been completed.

As a fourth example, the subtiler 326, in conjunction with the MMU 328, may attempt to prewarm an L3 cache. The subtiler 326 may format the CR command to the L3 cache as a cache read op code and pass the cache read op code, via the output bus 340 and the MSMC, to the L3 cache memory itself. The L3 cache then loads the appropriate data into the L3 cache. In certain cases, this L3 cache may be located within the internal or external memory managed by the MSMC. In such cases, the MSMC may receive the CR command and perform the prewarming by requesting the appropriate data and loading the requested data in the L3 cache. After the L3 cache loads the data, the L3 cache may return a response indicating the load was successful. This response may also include the data pulled into the L3 cache. This data in the return message may, in certain cases, be discarded In certain cases, coherency may be controlled for a CR command based on one or more fields of the CR command. In certain cases, the CR command may indicate that the requested data is shared or owned. In cases where the CR command indicates that the requested data is shared, the CR command may be converted to the appropriate read op code and the requested data read. In cases where the CR command indicates that the requested data is owned, the MSMC may be configured to verify that the requested data is not being accessed by another process. In certain cases, the MSMC may be able to track memory being accessed by a process based on an identifier associated with an input/output (IO) request of the process. For example, an IO request of a process may be identified based on an IO space identifier (IOSID). The IOSID uniquely identifies an IO request and indicates the process associated with the IO request. The MSMC may maintain one or more tables identifying the IO requests associated with each process. If a CR command is received requesting ownership of a particular memory location, the MSMC may verify, using the one or more tables, whether another process is accessing the memory location. If the requested data is being accessed, by another process, the MSMC may wait until the other process is complete. The MSMC may then lock the memory locations of the requested data such that another process cannot access the requested data, for example, by an indication stored in the one or more tables. The MSMC may then route the read op code to the appropriate cache memory to access the requested data.

Figure 4:
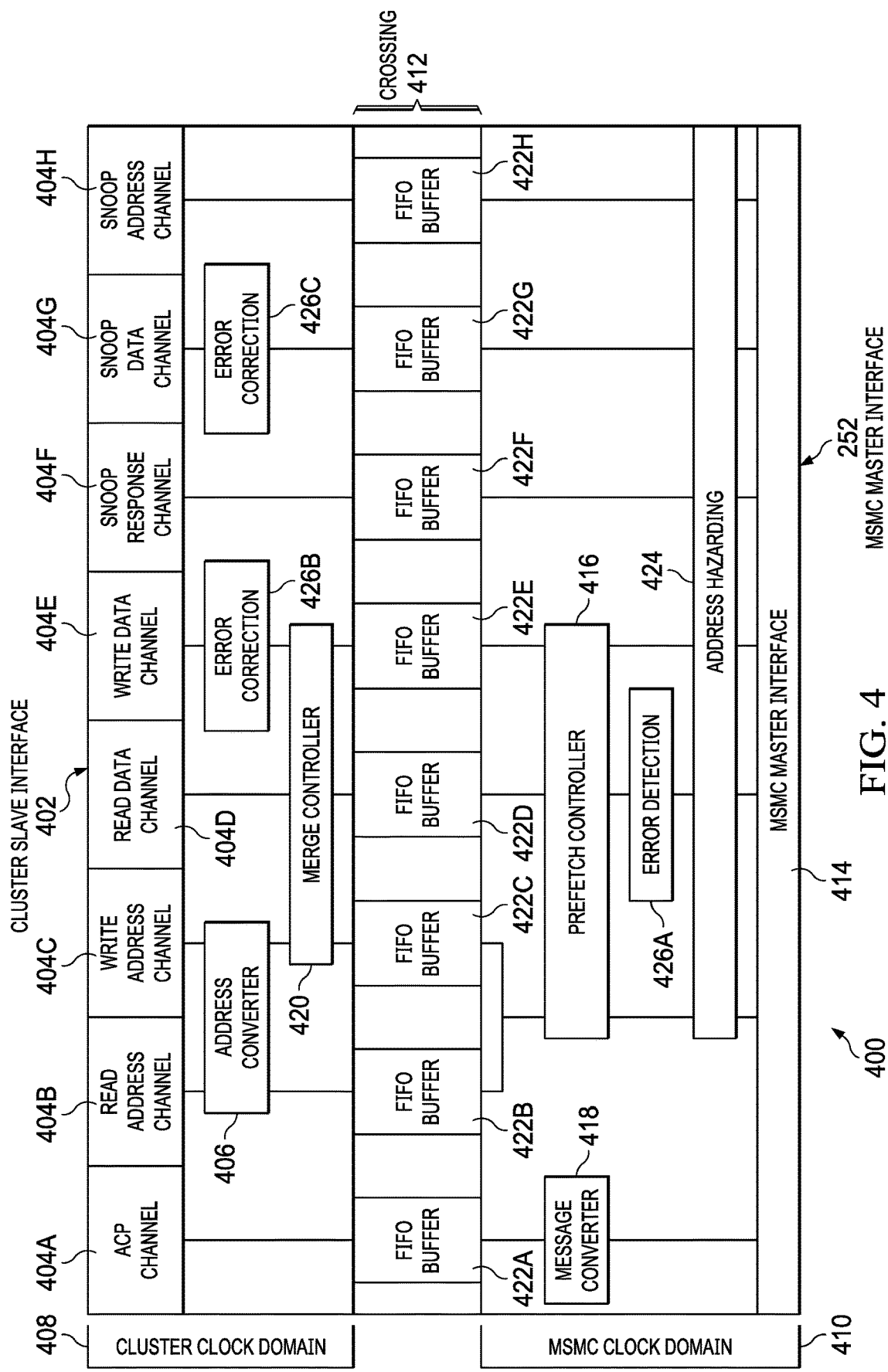
FIG. 4 is a block diagram of a MSMC bridge, in accordance with aspects of the present disclosure.

FIG. 4 is a block diagram of a MSMC bridge 400, in accordance with aspects of the present disclosure. The MSMC bridge 400 includes a cluster slave interface 402, which may be coupled to a master peripheral to provide translations services. The cluster slave interface 402 communicates with the master peripheral through a set of channels 404A-404H. In certain cases, these channels include an ACP channel 404A, read address channel 404B, write address channel 404C, read data channel 404D, write data channel 404E, snoop response channel 404F, snoop data channel 404G, and snoop address channel 404H. The cluster slave interface 402 responds to the master peripheral as a slave and provides the handshake and signal information for communication with the master peripheral as a slave device. An address converter 406 helps convert read addresses and write addresses between address formats used by the master peripheral and the MSMC. The ACP, read and write addresses as well as the read data, write data, snoop response, snoop data and snoop addresses pass between a cluster clock domain 408 and a MSMC clock domain 410 via crossing 412 and on to the MSMC via a MSMC master interface 414. The cluster clock domain 408 and the MSMC clock domain 410 may operate at different clock frequencies and with different power consumption requirements.

The crossing 412 may use a level detection scheme to asynchronously transfer data between domains. In certain cases, transitioning data across multiple clock and power domains incur an amount of crossing expense in terms of a number of clock cycles, in both domains, for the data to be transferred over. Buffers may be used to store the data as they are transferred. Data being transferred are stored in asynchronous FIFO buffers 422A-422H, which include logic straddling both the cluster clock domain 408 and the MSMC clock domain 410. Each FIFO buffer 422A-422H include multiple data slots and a single valid bit line per data slot. Data being transferred between may be placed in the data slots and processed in a FIFO manner to transfer the data as between the domains. The data may be translated, for example, between the MSMC bus protocol to a protocol in use by the master peripheral while the data is being transferred over. This overlap of the protocol conversion with the domain crossing expense helps limit overall latency for domain crossing.

In certain cases, the ACP channel 404A may be used to help perform cache prewarming. The ACP channel help allow access to cache of a master peripheral. When a prefetch message is received, for example from the DRU, the prewarm message may be translated into a format appropriate for the master peripheral by a message converter 418 and sent, via the ACP channel 404A to the master peripheral. The master peripheral may then request the memory addresses identified in the prewarm message and load data from the memory addresses into the cache of the master peripheral.

In certain cases, the MSMC bridge may be configured to perform error detection and error code generation to help protect data integrity. In this example, error detection may be performed on data returned from a read request from the MSMC master interface 414 by an error detection unit 426A. Additionally, error detection and error code generation may be provided by error detection units 426B and 426C for write data and snoop data, respectively. Error detection and error code generation may be provided by any known ECC scheme.

In certain cases, the MSMC bridge 400 includes a prefetch controller 416. The prefetch controller attempts to predict, based on memory addresses being accessed, whether and which additional memory addresses may be accessed in the future. The prediction may be based on one or more heuristics, which detects and identifies patterns in memory accesses. Based on these identified patterns, the prefetch controller 416 may issue additional memory requests. For example, the prefetch controller 416 may detect a series of memory requests for set of memory blocks and identify that these requests appear to be for sequential memory blocks. The prefetch controller 416 may then issue additional memory requests for the next N set of sequential memory blocks. These additional memory requests may cause, for example, the requested data to be cached in a memory cache, such as a L2 cache, of the master peripheral or in a cache memory of the MSMC, such as the RAM banks 218 of FIG. 2, or in the MSMC itself.

As prefetching may introduce coherency issues where a prefetched memory block may be in use by another process, the prefetch controller 416 may detect how the requested memory addresses are being accessed, for example, whether the requested memory addresses are shared or owned and adjust how prefetching is performed accordingly. In shared memory access, multiple processes may be able to access a memory address and the data at the memory address may be changed by any process. For owned memory access, a single process exclusively has access to the memory address and only that process may change the data at the memory address. In certain cases, if the memory accesses are shared memory reads, then the prefetch controller 416 may prefetch additional memory blocks using shared memory accesses. The MSMC bridge 400 may also include an address hazarding unit 424 which tracks each outstanding read and write transaction, as well as snoop transactions sent to the master peripheral. For example, when a read request is received from the master peripheral, the address hazarding unit 424 may create a scoreboard entry to track the read request indicating that the read request is in flight. When a response to the read request is received, the scoreboard entry may be updated to indicate that the response has been received, and when the response is forwarded to the master peripheral, the scoreboard entry may be cleared. If the prefetch controller 416 detects that the memory access includes owned read or write accesses, the prefetch controller 416 may perform snooping, for example by checking with the prefetch controller 416 or the snoop filter 212 of FIG. 2, to determine if the memory blocks to be prefetched are otherwise in use or overlap with addresses used by other processes. In cases where a prefetched memory block is accessed by another process, for example if there are overlapping snoop requests or a snoop request for an address that is being prefetched, then the prefetch controller 416 may not issue the prefetching commands or invalidate prefetched memory blocks. In these cases, the snoop is fully serviced and responded to by the MSMC and not forwarded to the master peripheral. Memory coherency is maintained throughout the entire process. For example, if the prefetched memory hazards with a write request from the master peripheral, the prefetched memory is invalidated. Likewise, the prefetch sequence can be cancelled if there is a hazard detection against subsequent write requests from the master peripheral.

In certain cases, snoop requests may arrive from the MSMC to the MSMC bridge 400. Where a snoop request from the MSMC for a memory address overlaps with an outstanding read or write to the memory address from a master peripheral, the address hazarding unit 424 may detect the overlap and stall the snoop request until the outstanding read or write is complete. In certain cases, read or write requests may be received by the MSMC bridge for a memory address which overlaps with a snoop request that has been sent to the master peripheral. In such cases, the address hazarding unit 424 may detect such overlaps and stall the read or write requests until a response to the snoop request has been received from the master peripheral.

The address hazarding unit 424 may also help provide memory barrier support. A memory barrier instruction may be used to indicate that a set of memory operations must be completed before further operations are performed. As discussed above, the address hazarding unit 424 tracks in flight memory requests to or from a master peripheral. When a memory barrier instruction is received, the address hazarding unit may check to see whether the memory operations indicated by the memory barrier instruction have completed. Other requests may be stalled until the memory operations are completed. For example, a barrier instruction may be received after a first memory request and before a second memory request. The address hazarding unit 424 may detect the barrier instruction and stall execution of the second memory request until after a response to the first memory request is received.

The MSMC bridge 400 may also include a merge controller 420. In certain cases, the master peripheral may issue multiple write requests for multiple, sequential memory addresses. As each separate write request has a certain amount of overhead, it may be more efficient to merge a number of these sequential write requests into a single write request. The merge controller 420 is configured to detect multiple sequential write requests as they are queued into the FIFO buffers and merge two or more of the write requests into a single write request. In certain cases, responses to the multiple write requests may be returned to the master peripheral as the multiple write requests are merged and prior to sending the merged write request to the MSMC. While described in the context of a write instruction, the merge controller 420 may also be configured to merge other memory requests, such as memory read requests. When a read request hazards on write data that has been merged, but not yet forwarded to MSMC, the merged write data is flushed prior to forwarding the read request to MSMC. Ordering is maintained such that the read request observes the merged write data (or any other write data from a different peripheral master which may be interleaved between the aforementioned read/write sequence internally in MSMC).

Figure 5:
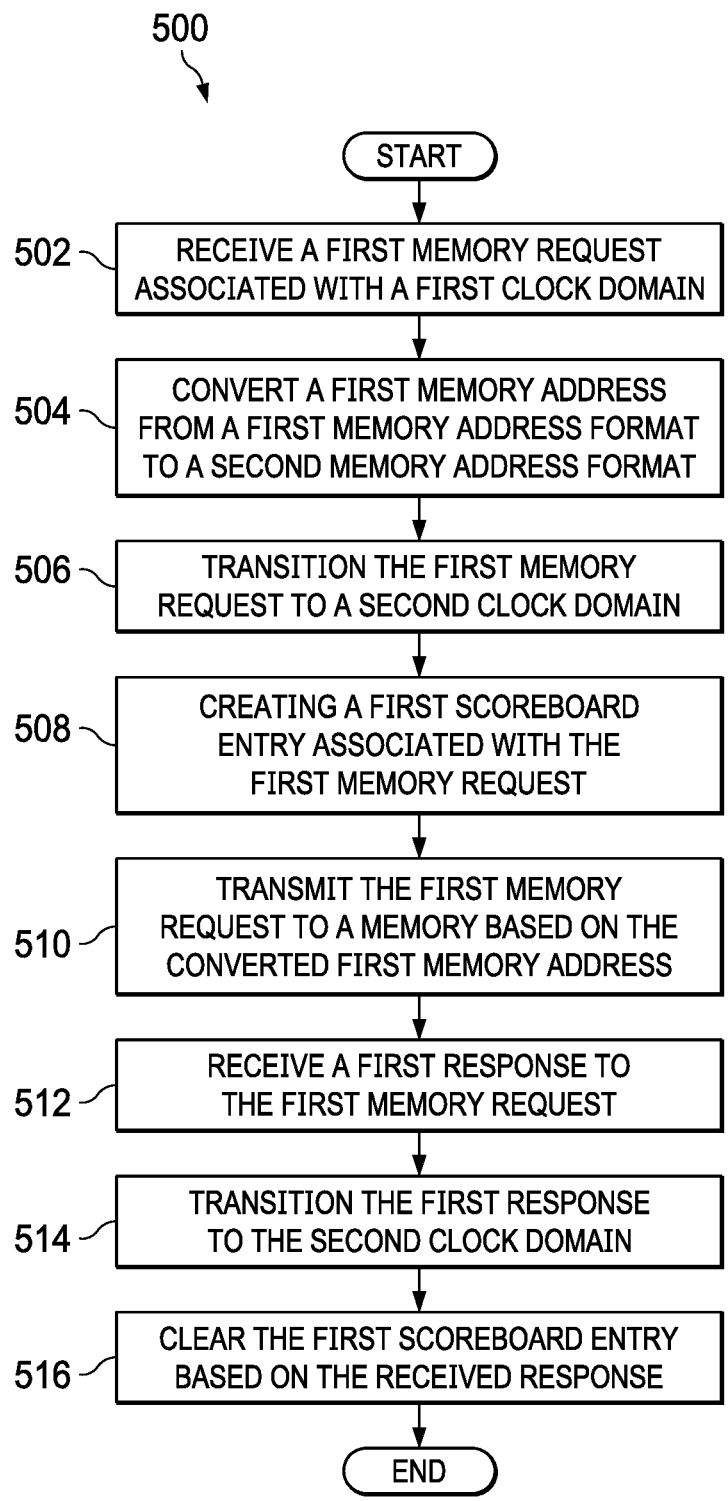
FIG. 5 is a flow diagram illustrating a technique for accessing memory by a bridge, in accordance with aspects of the present disclosure.

FIG. 5 is a flow diagram illustrating a technique 500 for accessing memory by a bridge, in accordance with aspects of the present disclosure. At block 502, the bridge receives a first memory request associated with a first clock domain via an interface. In a first example, the bridge, at a cluster slave interface, may receive a request to access memory, such as a read or write command, from a master peripheral. In another example, the bridge may receive, at a MSMC master interface, a read or snoop request from a memory controller, such as a MSMC. At block 504, an address converter converts a first memory address of the first memory request from a first memory address format associated with the first clock domain to a second memory address format associated with the second clock domain. In the first example, the memory address may be in a format supported by the master peripheral and this memory address may be reformatted to a format supported by the memory controller. In the other example, the memory address may be in a format supported by the memory controller and this memory address may be reformatted to a format supported by the master peripheral. At block 506, a plurality of buffers, such as FIFO buffers transition the first memory request to a second clock domain. In certain cases, memory address reformatting may be performed on memory addresses stored in the FIFO buffers. At block 508, address hazarding circuitry creates a first scoreboard entry associated with the first memory request. For example, address hazarding circuitry tracks each memory request through the memory request's lifetime though scoreboarding. In certain cases, this scoreboarding may be used as a part of snooping, merging memory requests, and/or for performing barrier instructions.

At block 510, a second interface transmits the first memory request to a memory based on the converted first memory address. In the first example, the MSMC master interface outputs the memory requests for transmission to the addressed memory. In the other example, the cluster slave interface transmits the memory request to a cache memory of the master peripheral. At block 512, the second interface receives a first response to the first memory request. In the first example, after the memory request is performed by a target memory, a response may be returned to the MSMC master interface. In the other example, after the memory request is performed by a target memory, a response may be returned to the cluster slave interface. At block 514, the plurality of buffers transition the first response to the second clock domain. In the first example, the response returned to the MSMC master interface is transitioned from the MSMC clock domain to the cluster clock domain. In the other example, the response returned to the cluster slave interface is transitioned from the cluster clock domain to the MSMC clock domain. At step 516, the address hazarding circuitry clears the first scoreboard entry based on the received response.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A processing system comprising:
   one or more processors;
   a cache memory coupled to the one or more processors; and
   a memory controller coupled to the one or more processors via a bridge, the bridge comprising:
      first interface circuitry configured to receive a first memory request associated with a first clock domain;
      address conversion circuitry configured to convert a first memory address associated with the first memory request from a first memory address format associated with the first clock domain to a second memory address format associated with the second clock domain;
      a plurality of buffers configured to transition the first memory request to a second clock domain;
      address hazarding circuitry configured to create a first scoreboard entry associated with the first memory request;
      second interface circuitry configured to:
         transmit the first memory request to a memory based on the converted first memory address; and
         receive a first response to the first memory request;
      wherein the plurality of buffers is further configured to transition the first response to the second clock domain; and
      wherein the address hazarding circuitry is further configured to clear the first scoreboard entry based on the received response.

2. The processing system of claim 1, wherein the first memory request is received from a master peripheral coupled to the first interface circuitry, wherein the first interface circuitry is further configured to receive a second memory request; and wherein the bridge further comprises a merge controller configured to:
   determine the first memory address and a second memory address associated with the second memory request are sequential memory addresses, and
   merge the first memory request and second memory request into a single memory request.

3. The processing system of claim 2, wherein the first memory request and the second memory request comprise write requests.

4. The processing system of claim 1, wherein the first memory request is received from a master peripheral coupled to the first interface circuitry, wherein the first interface circuitry is further configured to receive a second memory request; wherein the first memory request and the second memory request comprise read requests; and wherein the bridge further comprises a prefetch controller configured to:
   determine a third memory address based on the on the first memory address and a second memory address associated with the second memory request, wherein the third memory address has not yet been requested by the master peripheral, and
   issue a third memory request based on the third memory address.

5. The processing system of claim 4, wherein the third memory address is determined based on a pattern identified as between the first memory address and the second memory address.

6. The processing system of claim 4, wherein the prefetch controller is further configured to snoop the third memory address to determine whether the third memory address is in use.

7. The processing system of claim 6, wherein the prefetch controller is further configured to determine whether to snoop the third memory address based on an indication that the first memory request or second memory request is for owned access.

8. The processing system of claim 1, wherein the first interface circuitry is further configured to receive a barrier instruction after the first memory request; wherein the address hazarding circuitry is further configured to stall a second memory request received after the barrier instruction until the first response to the first memory request is received.

9. The processing system of claim 1, wherein the bridge further comprises error detection circuitry for detecting errors in data associated with the first memory request or data associated with the first response.

10. An integrated circuit (IC) device comprising:
    a bridge coupled to a memory controller and to one or more processors, the bridge comprising:
       first interface circuitry configured to receive a first memory request associated with a first clock domain;
       address conversion circuitry configured to convert a first memory address, associated with the first memory request, from a first memory address format associated with the first clock domain to a second memory address format associated with the second clock domain;
       a plurality of buffers configured to transition the first memory request to a second clock domain;
       address hazarding circuitry configured to create a first scoreboard entry associated with the first memory request;
       second interface circuitry configured to:
          transmit the first memory request to a memory based on the converted first memory address; and
          receive a first response to the first memory request;
       wherein the plurality of buffers is further configured to transition the first response to the second clock domain; and wherein the address hazarding circuitry is further configured to clear the first scoreboard entry based on the received response.

11. The IC device of claim 10, wherein the first memory request is received from a master peripheral coupled to the first interface circuitry, wherein the first interface circuitry is further configured to receive a second memory request; and wherein the bridge further comprises a merge controller configured to:
    determine the first memory address and a second memory address associated with the second memory request are sequential memory addresses, and
    merge the first memory request and second memory request into a single memory request.

12. The IC device of claim 11, wherein the first memory request and the second memory request comprise write requests.

13. The IC device of claim 10, wherein the first memory request is received from a master peripheral coupled to the first interface circuitry, wherein the first interface circuitry is further configured to receive a second memory request; wherein the first memory request and the second memory request comprise read requests; and wherein the bridge further comprises a prefetch controller configured to:
    determine a third memory address based on the on the first memory address and a second memory address associated with the second memory request, wherein the third memory address has not yet been requested by the master peripheral, and
    issue a third memory request based on the third memory address.

14. The IC device of claim 13, wherein the third memory address is determined based on a pattern identified as between the first memory address and the second memory address.

15. The IC device of claim 13, wherein the prefetch controller is further configured to snoop the third memory address to determine whether the third memory address is in use.

16. The IC device of claim 15, wherein the prefetch controller is further configured to determine whether to snoop the third memory address based on an indication that the first memory request or second memory request is for owned access.

17. The IC device of claim 10, wherein the first interface circuitry is further configured to receive a barrier instruction after the first memory request; wherein the address hazarding circuitry is further configured to stall a second memory request received after the barrier instruction until the first response to the first memory request is received.

18. The IC device of claim 1, wherein the bridge further comprises error detection circuitry for detecting errors in data associated with the first memory request or data associated with the first response.

19. A method for accessing data, comprising:
    receiving a first memory request associated with a first clock domain;
    converting a first memory address of the first memory request from a first memory address format associated with the first clock domain to a second memory address format associated with the second clock domain;
    transitioning the first memory request to a second clock domain;
    creating a first scoreboard entry associated with the first memory request;
    transmitting the first memory request to a memory based on the converted first memory address;
    receiving a first response to the first memory request;
    transitioning the first response to the second clock domain; and
    clearing the first scoreboard entry based on the received response.

20. The method of claim 19, wherein the first memory request is received from a master peripheral and further comprising:
    receiving a second memory request;
    determining the first memory address and a second memory address associated with the second memory request are sequential memory addresses, and
    merging the first memory request and second memory request into a single memory request.

* * * * *